(12) United States Patent
Kmetec et al.

(10) Patent No.: US 9,113,533 B2
(45) Date of Patent: Aug. 18, 2015

(54) SEMICONDUCTOR PACKAGE WITH INCORPORATED LIGHT OR TEMPERATURE SENSORS AND TIME MULTIPLEXING

(75) Inventors: Jeffrey Dellert Kmetec, Palo Alto, CA (US); Frans Maurits Vos, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 713 days.

(21) Appl. No.: 12/864,525

(22) PCT Filed: Jan. 23, 2009

(86) PCT No.: PCT/IB2009/050273
§ 371 (c)(1),
(2), (4) Date: Dec. 16, 2011

(87) PCT Pub. No.: WO2009/095829
PCT Pub. Date: Aug. 6, 2009

(65) Prior Publication Data
US 2012/0248988 A1    Oct. 4, 2012

(30) Foreign Application Priority Data
Jan. 30, 2008  (EP) .................................. 08150811

(51) Int. Cl.
*H05B 37/02* (2006.01)
*H05B 33/08* (2006.01)

(52) U.S. Cl.
CPC ........ *H05B 33/0872* (2013.01); *H05B 33/0818* (2013.01); *H05B 33/0869* (2013.01); *H01L 2924/0002* (2013.01)

(58) Field of Classification Search
USPC ............................ 315/149–154; 257/79–103
See application file for complete search history.

(56) References Cited

U.S. PATENT DOCUMENTS

| | | | |
|---|---|---|---|
| 6,127,783 A | 10/2000 | Pashley et al. | |
| 2003/0020415 A1 | 1/2003 | Bruning | |
| 2003/0030808 A1 | 2/2003 | Marshall et al. | |
| 2003/0222587 A1* | 12/2003 | Dowling et al. | 315/149 |
| 2003/0227020 A1* | 12/2003 | Huang et al. | 257/79 |
| 2005/0040421 A1 | 2/2005 | Wu | |
| 2005/0274956 A1* | 12/2005 | Bhat | 257/79 |
| 2006/0012986 A1 | 1/2006 | Mazzochette et al. | |

(Continued)

FOREIGN PATENT DOCUMENTS

| | | |
|---|---|---|
| DE | 3035944 A1 | 4/1982 |
| DE | 102004042185 A1 | 3/2006 |

(Continued)

*Primary Examiner* — Douglas W Owens
*Assistant Examiner* — Jonathan Cooper
(74) *Attorney, Agent, or Firm* — Yuliya Mathis

(57) ABSTRACT

Proposed is a package (10) having at least two pins (11, 12). The package comprises a semiconductor structure (20) having a first function and an electrical circuit (30) comprising at least one circuit element having a second function. The structure (20) and the circuit (30) are electrically connected to the pins (11, 12). Moreover, the package is operable to perform the first and second function by time multiplexing a first (60) and second (70) operating signal through the pins (11, 12). Finally, the first function is a lighting function and the second function is a sensing function. The invention is especially advantageous as it provides a cost effective and versatile miniaturized light emitting package comprising LEDs or laser diodes.

16 Claims, 3 Drawing Sheets

(56) References Cited

U.S. PATENT DOCUMENTS

| | | |
|---|---|---|
| 2006/0202915 A1 | 9/2006 | Chikugawa |
| 2007/0170449 A1 | 7/2007 | Anandan |
| 2007/0246716 A1 | 10/2007 | Bhat et al. |
| 2007/0246729 A1 | 10/2007 | Park |
| 2007/0278500 A1 | 12/2007 | Lin |
| 2008/0191631 A1 * | 8/2008 | Archenhold et al. ......... 315/158 |

FOREIGN PATENT DOCUMENTS

| | | |
|---|---|---|
| DE | 102005042082 A1 | 3/2007 |
| RU | 2151424 C1 | 6/2000 |
| WO | 2006019790 A2 | 2/2006 |
| WO | WO2007/066264 * | 6/2007 |

* cited by examiner

SEMICONDUCTOR PACKAGE WITH INCORPORATED LIGHT OR TEMPERATURE SENSORS AND TIME MULTIPLEXING

FIELD OF THE INVENTION

The invention relates to a package having at least two pins, the package comprising a semiconductor structure. Furthermore the invention relates to module comprising such packages, and to a method of operating such packages & modules.

BACKGROUND OF THE INVENTION

Packages and modules of the kind set forth comprising light emitting diodes (LEDs) are well known. They may be used in a multitude of applications, such as (general) illumination, backlighting for LCDs or signs, etc. Typically, such packages include an electrical circuit. This circuit, for instance, consists of an electrostatic discharge protection diode arranged anti-parallel relative to the LED for protection against static electricity or reversed voltage. Alternatively, the circuit consists of a second LED, similarly arranged anti-parallel to the first, allowing the package to be driven with f.i. an AC current. Possibly, the two LEDs emit light at different wavelengths, allowing colour mixing.

The prior art packages lack colour stability under typical operating conditions. Amongst others the physical processes operating in the LEDs cause the light emitted to be sensitive to the junction temperature. Many active and passive feedback/forward control schemes have been proposed, relying on temperature or light sensors, to ensure colour stability of the light emitted. Classically, such sensors have been arranged inside a light emitting module or luminary comprising the packages as light sources. This, however, results in a complex device producible against high assembly costs. Furthermore, as the sensors are assembled in the module exterior to the packages, they have a low selectivity towards the identity and the contribution of the individual packages. In addition, known packages are only able to detect faulty LEDs via electrical means, such as the measurement of a voltage drop over an LED, when applying >2 access pins. For instance, applying a string of four LEDs in series in a single package having only two access pins, it is not possible to determine a single faulty led in the string with such a voltage drop measurement.

SUMMARY OF THE INVENTION

It is an objective of the present invention to provide a cost effective and versatile package. A further objective of the invention is to provide a package enabling the determination of a faulty LED, without the need for additional access pins. Furthermore, the invention has as an objective to provide a miniaturized package and/or module. Moreover, the invention has as an objective to provide for a (light and temperature) sensor assembly having a high selectivity towards the identity of and contribution from the (light and heat) sources. At least one of these objectives is achieved with the package according a first aspect of the invention in accordance with claim 1. A package having at least two pins, the package comprising a semiconductor structure having a first function, an electrical circuit comprising at least one circuit element having a second function, wherein the structure and the circuit are electrically connected to the pins, wherein the package is operable to perform the first and second function by time multiplexing a first and second operating signal through the pins, and wherein the first function is a lighting function and the second function is a sensing function.

The invention is based on the insight that semiconductor light emitting structures, such as light emitting diodes (LEDs), resonant cavity light emitting diodes (RCLEDs), vertical cavity laser diodes (VCSELs), and edge emitting laser diodes, provide an excellent opportunity for pin sharing through time multiplexing, because they only conduct current in one direction. In addition, pulsed or modulated operation of these structures is common, i.e. they normally are not driven continuously. Consequently, not providing a drive current to the semiconductor structure during part of the time makes re-using the pins for another function possible. Moreover, designing packages with a minimum number of access pins has an advantage for cost reasons. Furthermore, design rules prescribe the packages to increase the pin count by multiple pins at a time. Thus the invention minimizes the number of access pins to the package realising a cost effective, versatile and miniaturized package. Finally, incorporating the sensors inside the package improves their selectivity towards the (light or heat) source inside the package relative to sources in side other packages.

In an embodiment of the invention the circuit comprises at least one DC operated device. In an embodiment the DC operated device comprises at least one of a temperature sensor or a light sensor. Advantageously, this allows for providing a feedback signal to control and stabilise the light output (flux, colour point, etc).

In an embodiment the circuit further comprises a diode arranged anti-parallel to the semiconductor light emitting structure. Advantageously, this arranges the two functions to be performed independently of one another.

In an embodiment the sensing function comprises one of a flux measurement or a colour point measurement. Again, this allows to control and stabilize the flux and/or colour point of the light emitted.

In an embodiment at least part of the circuit is integrated in the semiconductor light emitting structure. In an embodiment the semiconductor light emitting structure comprises a sub-mount and the circuit is integrated on the sub-mount. This allows for an even larger degree of the integration.

In an embodiment the semiconductor light emitting structure comprises at least one of a light emitting diode (LED) or a laser diode (LD).

According to a second aspect the invention provides a light emitting module comprising at least one package according invention. Advantageously, this allows providing a light emitting assembly (such as a luminary or the like) having sensing and feedback capabilities with a high selectivity towards the identity of and contribution from the (light and heat) sources.

In an embodiment the module further comprises processing means arranged to time multiplex the first and second operating signals. Preferably, these processing means comprise an (integrated or discrete) circuit driving the LED or LD as well as collecting the feedback/feedforward signal from the sensor enabling the adjustment of the driving signals in order to stabilize a predetermined output (flux, colour point, etc) of the light emitting module.

According to a third aspect the invention provides a method of operating a light emitting module comprising the steps arranging the module to comprise at least one package having at least two pins, arranging the package to comprise a semiconductor structure having a first function and an electrical circuit having a second function, and electrically connecting the structure and the circuit to the pins, operating the package to perform the first and second function by time multiplexing a first and second operating signal through the pins, wherein the first function is a lighting function and the second function is a sensing function.

These and other aspects of the invention will be apparent from and elucidated with reference to the embodiments described hereinafter.

BRIEF DESCRIPTION OF THE DRAWINGS

Further details, features and advantages of the invention are disclosed in the following description of exemplary and preferred embodiments in connection with the drawings.

DETAILED DESCRIPTION OF THE EMBODIMENTS

Figure 1:
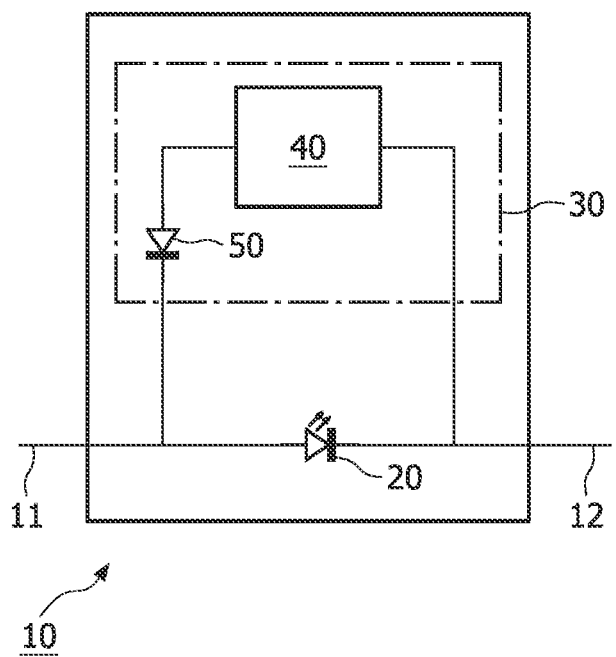
FIG. 1 schematically shows an embodiment according to the invention.

FIG. 1 schematically shows an embodiment according to the invention. A package 10 having at least two pins 11,12 enabling the package to be connected to for instance a power source (not shown). The package 10 comprises a semiconductor structure 20, such as light emitting diodes (LEDs), resonant cavity light emitting diodes (RCLEDs), vertical cavity laser diodes (VCSELs), and edge emitting laser diodes. Furthermore, the package 10 comprises an electrical circuit 30. This circuit 30 comprises a diode 50 and a DC operated device 40. The diode 50 is arranged anti-parallel to the semiconductor structure 20. Consequently, the diode 50 shuts down the DC device when the semiconductor structure 20 is operated to emit light. Furthermore, the diode 50 protects the DC operated device 40 against a reverse polarity. It is noted that some DC operated devices have a diode property of themselves (f.i. a light and temperature sensitive diode). In such a case, the diode 50 and DC operated device 40 may be combined in one circuit element. This configuration allows using the pins 11,12 sequentially for two different functions.

Figure 2:
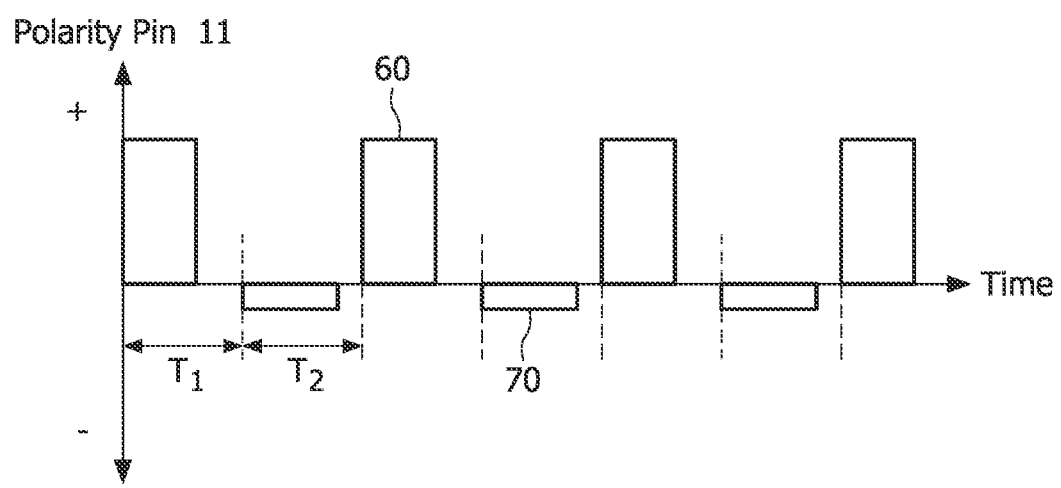
FIG. 2 shows a time multiplexing scheme operating the package according to the invention.

FIG. 2 shows a time multiplexing scheme operating the package 10 according to the invention. It depicts the polarity of the electrical signals on pin 11 as a function of time. The multiplexing scheme subdivides time in intervals with a predetermined length $T_1$ and $T_2$ (which may or may not be of equal length). During the $T_1$ interval a first operating signal 60 with a positive polarity on pin 11 drives the semiconductor structure 20. During the $T_2$ interval a second operating signal 70 with a positive polarity on pin 12 (equivalent to a negative polarity on pin 11) drives the DC operated device 40. For instance, with the semiconductor structure 10 arranged as an LED, the first function may be a lighting function. The first operating signal 60 may be a PWM based drive signal, having a fixed height and a variable width defining the light flux emitted. Alternatively, the first operating signal may be a PAM based signal, having a fixed width and a variable height (or amplitude) defining the light flux emitted. Many other drive signal (DC or modulated) schemes exist in the art and may be applied without departing from the spirit and scope of the invention. Moreover, arranging the DC operated device 40 as a sensor allows the second function to be a sensing function. Beneficially, such a sensor may comprise a temperature sensor. Alternatively it may comprise a light sensor. Thus, the second operating signal 70 may probe the temperature measured or the light detected. Beneficially this allows for providing a feedback signal to control and stabilize the flux and/or colour point of the light emitted. Many other multiplexing schemes can be envisioned operating the package 10 without departing from the spirit and scope of the invention.

Figure 3:
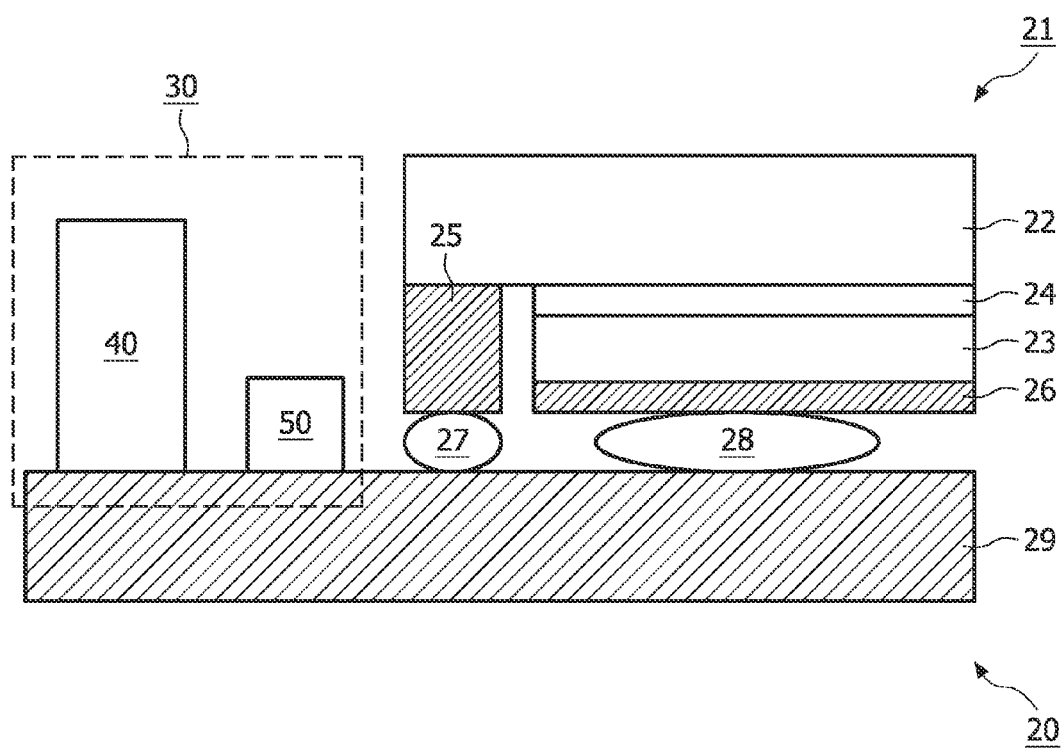
FIG. 3 schematically shows a semiconductor structure comprising a sub-mount with integrated circuit elements.

While in the embodiment above, the package 10 comprises the semiconductor structure 20 and the electrical circuit 30, these later two may be present as discrete components or may be integrated. Thus, in an embodiment at least part of the circuit 30 is integrated in the semiconductor structure 20. In an embodiment the semiconductor structure 20 comprises a sub-mount 29 and the circuit 30 is integrated on the sub-mount (FIG. 3). This allows for an even larger degree of the integration. In this embodiment the sub-mount 29 comprises electrical circuitry (not shown) on its top surface interconnecting the DC operated device 40, the diode 50, and a semiconductor light source 21. Furthermore it allows for interconnection to the pins 11,12 of the package 10. The semiconductor light source 21 comprises a layer of a first conductivity type 22 (f.i. n-type) and a layer of a second conductivity type 23 (f.i. p-type), sandwiching a junction layer 24 arranged to emit light at a predetermined wavelength when an appropriate drive signal is applied to the light source 21. The layers of the first 22 and second 23 conductivity types are connected to contact layers 25 and 26, respectively. Solder bumps 27, 28 allow for connection to the electrical circuitry on sub-mount 29.

Figure 4:
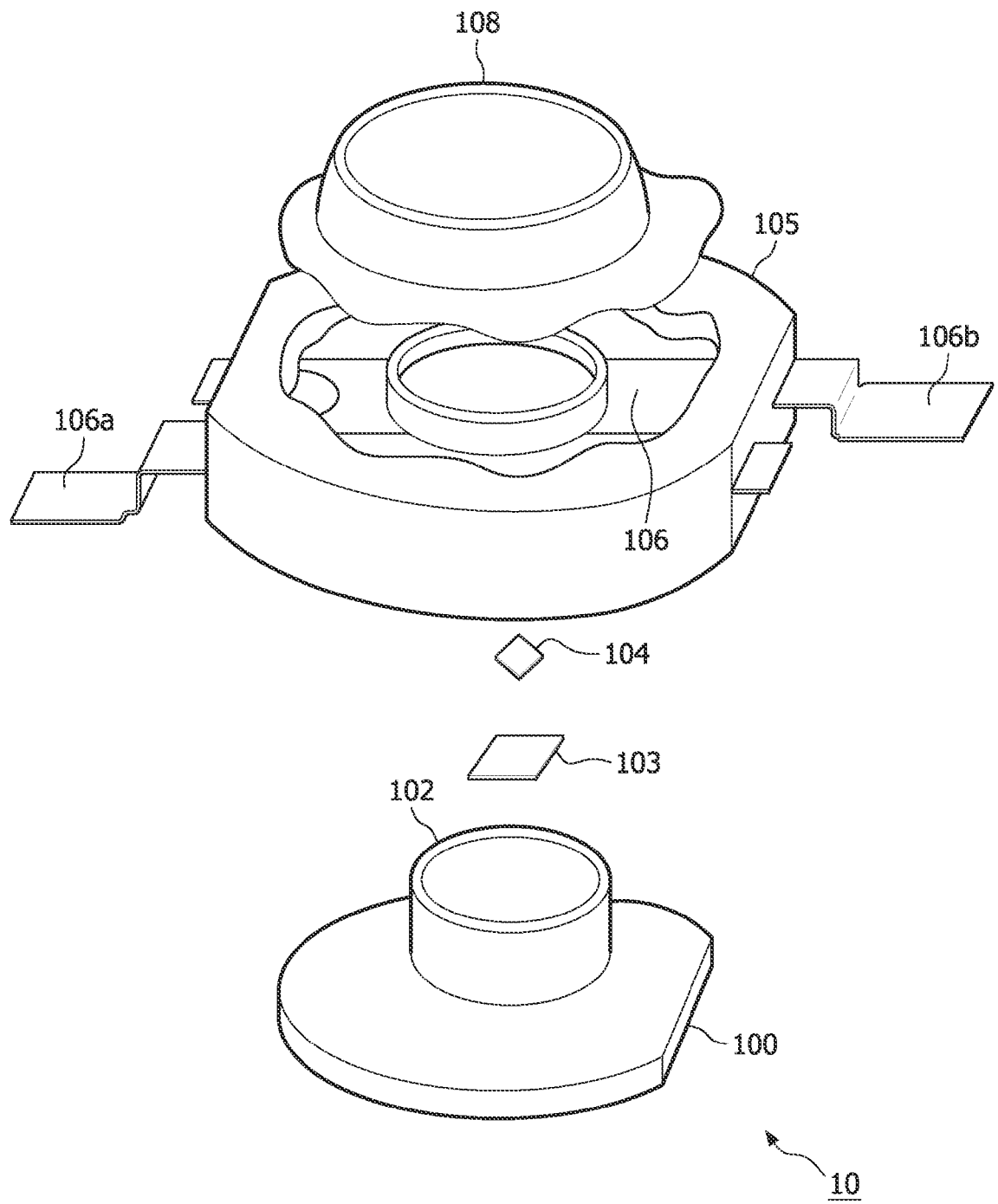
FIG. 4 shows an exploded view of an embodiment of package according to the invention.

FIG. 4 shows an exploded view of a package 10. In an embodiment the package comprises a heat-sink slug 100 placed into an insert molded leadframe. The insert molded leadframe is, for example, a filled plastic material 105 molded around a metal frame 106 that provides an electrical path via the pins 106a, 106b. Slug 100 may include an optical reflector 102. The semiconductor light emitting structure 104 is mounted directly or indirectly via a thermally conducting sub-mount 103 to slug 100. The circuit 30 (not shown) may be integrated in the semiconductor light emitting structure 104. Alternatively, it may be integrated on the sub-mount 103. Alternatively, it may be integrated inside the molded plastic material 105. A cover 108, which may be an optical lens, may be added.

Assembling a multitude of packages 10 in a module allows for fabricating a light emitting luminary (or the like). Advantageously, this provides the light emitting assembly with sensing and feedback capabilities with a high selectivity towards the identity of and contribution from the (light and heat) sources. By integrating the sensors inside the packages 10 they effectively only measure the appropriate characteristics (temperature, light) of the light sources inside the same package 10. In an embodiment the module further comprises processing means arranged to time multiplex the first 60 and second 70 operating signals. Preferably, these processing means comprise an (integrated or discrete) circuit driving the LED or LD as well as collecting the feedback/feedforward signal from the sensor enabling the adjustment of the driving signals in order to stabilize a predetermined output (flux, colour point, etc) of the light emitting module.

Although the invention has been elucidated with reference to the embodiments described above, it will be evident that alternative embodiments may be used to achieve the same objective. For instance the package may comprise more than one semiconductor structure 20 with its pertaining circuit 30 in combination with an appropriate number of pins. The scope of the invention is therefore not limited to the embodiments described above. Accordingly, the spirit and scope of the invention is to be limited only by the claims and their equivalents.

The invention claimed is:

1. A package having at least two pins, the package comprising:
a semiconductor structure having a lighting function;
an electrical circuit comprising at least one circuit element having a sensing function, said circuit element having a diode property and being arranged anti-parallel to the semiconductor structure; and
wherein the structure and the circuit are electrically connected to the pins;
wherein the package is operable to only alternately perform the lighting function and the sensing function by time multiplexing a first operating signal with a positive polarity and a second operating signal with a negative polarity across the pins.

2. The package according to claim 1, wherein the electrical circuit comprises at least one DC operated device comprising at least one of a temperature sensor and a light sensor.

3. The package according to claim 1, wherein the circuit further comprises diode arranged anti-parallel to the semiconductor structure.

4. The package according to claim 1, wherein the sensing function comprises one of a flux measurement or a colour point measurement.

5. The package according to claim 1, wherein at least part of the circuit is integrated in the semiconductor structure.

6. The package according to claim 5, wherein the semiconductor structure comprises a sub-mount and the circuit is integrated on the sub-mount.

7. The package according to claim 1, wherein the semiconductor structure comprises at least one of a light emitting diode and a laser diode.

8. A light emitting module according comprising a package according to claim 1.

9. The light emitting module according to claim 8, wherein the module further comprises processing means arranged to time multiplex the first and second operating signals.

10. A method of operating a light emitting module, comprising the steps of:
arranging the module to comprise a package having at least two pins;
arranging the package to comprise a semiconductor structure having a lighting function and an electrical circuit comprising at least one circuit element having a sensing function, said circuit element having a diode property and being arranged anti-parallel to the semiconductor structure, wherein the semiconductor structure is arranged to only alternately perform the lighting function and the sensing function;
electrically connecting the structure and the circuit to the pins; and
operating the package to alternately perform the lighting function and the sensing function by time multiplexing a first operating signal with a positive polarity and second operating signal with a negative polarity across the pins.

11. The method of claim 10, further comprising driving the semiconductor structure during a first time interval using the first operating signal with the positive polarity.

12. The method of claim 10, further comprising driving the at least one circuit element during a second time interval using the second operating signal with the negative polarity.

13. The method of claim 10, wherein performing the sensing function comprises measuring one of temperature and light emitted.

14. The method of claim 10, further comprising providing a feedback signal to control and stabilize at least one of the flux and colour point.

15. The package according to claim 1, wherein the first operating signal comprises a PWM based drive signal.

16. The package according to claim 1, wherein the first operating signal comprises a PAM based signal.

* * * * *